United States Patent
Hagimoto et al.

(10) Patent No.: US 10,319,587 B2
(45) Date of Patent: Jun. 11, 2019

(54) METHOD OF MANUFACTURING EPITAXIAL WAFER AND SILICON-BASED SUBSTRATE FOR EPITAXIAL GROWTH

(71) Applicant: SHIN-ETSU HANDOTAI CO., LTD., Tokyo (JP)

(72) Inventors: Kazunori Hagimoto, Takasaki (JP); Masaru Shinomiya, Annaka (JP); Keitaro Tsuchiya, Takasaki (JP); Hirokazu Goto, Minato-ku (JP); Ken Sato, Miyoshi-machi (JP); Hiroshi Shikauchi, Niiza (JP); Shoichi Kobayashi, Jyoetsu (JP); Hirotaka Kurimoto, Jyoetsu (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/120,924

(22) PCT Filed: Feb. 10, 2015

(86) PCT No.: PCT/JP2015/000595
§ 371 (c)(1),
(2) Date: Aug. 23, 2016

(87) PCT Pub. No.: WO2015/133063
PCT Pub. Date: Sep. 11, 2015

(65) Prior Publication Data
US 2016/0365239 A1  Dec. 15, 2016

Related U.S. Application Data

(63) Continuation of application No. PCT/JP2015/000595, filed on Feb. 10, 2015.

(30) Foreign Application Priority Data

Mar. 4, 2014 (JP) .................. 2014-041976

(51) Int. Cl.
*H01L 29/32* (2006.01)
*H01L 21/02* (2006.01)
(Continued)

(52) U.S. Cl.
CPC ........ *H01L 21/0254* (2013.01); *C30B 25/183* (2013.01); *C30B 29/403* (2013.01);
(Continued)

(58) Field of Classification Search
CPC ........... H01L 21/0254; H01L 21/02378; H01L 21/02381; H01L 21/0243; H01L 21/02458; H01L 29/2003
See application file for complete search history.

(56) References Cited

U.S. PATENT DOCUMENTS

| 5,882,401 | A | * | 3/1999 | Maruyama | ............ C30B 29/06 117/106 |
| 2008/0057324 | A1 | * | 3/2008 | Nakahara | ............... C30B 25/20 428/446 |

(Continued)

FOREIGN PATENT DOCUMENTS

| CN | 103137656 A | 6/2013 |
| JP | S59-227117 A | 12/1984 |

(Continued)

OTHER PUBLICATIONS

Nov. 15, 2016 Office Action issued in Japanese Patent Application No. 2014-041976.
(Continued)

*Primary Examiner* — Ahmed N Sefer
(74) *Attorney, Agent, or Firm* — Oliff PLC

(57) ABSTRACT

A method of manufacturing an epitaxial wafer having an epitaxial layer on a silicon-based substrate, the method of manufacturing the epitaxial wafer including epitaxially growing a semiconductor layer on the silicon-based sub-
(Continued)

strate after applying terrace processing to an outer peripheral portion of the silicon-based substrate. As a result, the method of manufacturing the epitaxial wafer having the epitaxial layer on the silicon-based substrate in which an epitaxial wafer which is completely free from cracks can be obtained, is provided.

10 Claims, 3 Drawing Sheets

(51) Int. Cl.
*C30B 25/18* (2006.01)
*C30B 29/40* (2006.01)
*H01L 29/20* (2006.01)

(52) U.S. Cl.
CPC .... *H01L 21/0243* (2013.01); *H01L 21/02378* (2013.01); *H01L 21/02381* (2013.01); *H01L 21/02458* (2013.01); *H01L 29/2003* (2013.01)

(56) References Cited

U.S. PATENT DOCUMENTS

| | | |
|---|---|---|
| 2009/0053894 A1 | 2/2009 | Koyata et al. |
| 2013/0069075 A1 | 3/2013 | Fujikura et al. |
| 2013/0087807 A1 | 4/2013 | Ikuta et al. |
| 2013/0140567 A1 | 6/2013 | Kim et al. |
| 2015/0028457 A1 | 1/2015 | Shikauchi et al. |
| 2017/0009378 A1* | 1/2017 | Shibata ................ C30B 23/00 |
| 2017/0029977 A1* | 2/2017 | Hagimoto ......... H01L 21/02381 |

FOREIGN PATENT DOCUMENTS

| | | |
|---|---|---|
| JP | S62-30336 A | 2/1987 |
| JP | 2007-246289 A | 9/2007 |
| JP | 2011-119336 A | 6/2011 |
| JP | 2011-165962 A | 8/2011 |
| JP | 2013-075815 A | 4/2013 |
| JP | 2013-118384 A | 6/2013 |
| JP | 2013-171898 A | 9/2013 |
| TW | 2008-05453 A | 1/2008 |
| WO | 2011/161975 A1 | 12/2011 |

OTHER PUBLICATIONS

Nov. 25, 2016 Office Action issued in Taiwanese Patent Application No. 104150359.
Mar. 31, 2015 International Search Report issued in International Patent Application No. PCT/JP2015/000595.
Sep. 6, 2016 International Preliminary Report on Patentability issued in International Patent Application No. PCT/JP2015/000595.
Jun. 5, 2017 Office Action issued in Taiwanese Patent Application No. 104105359.
Mar. 23, 2018 Office Action issued in Chinese Patent Application No. 201580011736.1.

* cited by examiner (a) Si SUBSTRATE GRINDING SURFACE DEPTH 6um off WIDTH 3mm off (b) Si SUBSTRATE DEPTH 50um off WIDTH 3mm off

METHOD OF MANUFACTURING EPITAXIAL WAFER AND SILICON-BASED SUBSTRATE FOR EPITAXIAL GROWTH

BACKGROUND OF THE INVENTION

1. Field of the Invention

The present invention relates to a method of manufacturing an epitaxial wafer having an epitaxial growth layer on a silicon-based substrate and a silicon-based substrate used for the method of manufacturing the epitaxial wafer.

2. Description of the Related Art

To manufacture a semiconductor epitaxial wafer, epitaxial growth is performed on a surface of a silicon-based substrate (such as, for example, a silicon substrate and a silicon carbide substrate), or the like, using a commercially available epitaxial manufacturing apparatus so that a hetero homoepitaxial wafer is manufactured.

In an epitaxial wafer in which an epitaxial growth layer composed of a nitride semiconductor is disposed on a silicon-based substrate, a film thickness of the epitaxial growth layer becomes thicker in an outer peripheral portion, which generates a crown in the epitaxial growth layer (a projection which is higher than a main surface of the epitaxial growth layer).

In order to make warpage of the silicon-based substrate and stress of the epitaxial growth layer optimal at a wafer central portion which is used as a semiconductor device, conditions for a thickness, or the like, of each layer of the epitaxial growth layers are selected. Therefore, if the crown is generated, balance between stress applied to the epitaxial growth layer and warpage of the substrate is lost, which affects the epitaxial growth layer, and generates a honeycomb crack, or the like, in the epitaxial growth layer in the vicinity of the outer peripheral portion (see, for example, FIG. 4).

To prevent generation of such a crown, a method has been proposed which chamfers the outer peripheral portion of the silicon-based substrate and forms an epitaxial growth layer thereon (for example, Patent Literature 1).

Further, as a countermeasure for a crack, there have been proposed to perform epitaxial growth after roughening the vicinity of an Si substrate edge (Patent Literature 2), to use a silicon substrate as a substrate for hetero epitaxial growth, the silicon substrate having as a main surface a (111) plane having orientation flat in a direction obtained by rotating a <110> direction counterclockwise by any angle of 30°, 90° and 150° while using the <111> direction as a rotation axis (Patent Literature 3), or to perform epitaxial growth in a state where a surrounding portion of the silicon-based substrate is covered with a ring (Patent Literature 4).

Further, in an epitaxial wafer in which a GaN layer or an AlN layer is epitaxially grown on a silicon substrate, when a crack is generated at a wafer end portion during epitaxial growth, gas of TMA (trimethyl aluminum) or TMG (trimethyl gallium) which is a material intrudes from space of the crack, reacts with Si and generates a reaction mark.

As a countermeasure for such a reaction mark, it has been proposed to epitaxially grow a thick GaN film via a buffer film (AlN film) on an SOI substrate (Patent Literature 5).

CITATION LIST

Patent Literature

[Patent Literature 1] Japanese Unexamined Patent Publication (Kokai) No. 59-227117

[Patent Literature 2] International Publication No. WO2011/161975

[Patent Literature 3] Japanese Unexamined Patent Publication (Kokai) No. 2011-165962

[Patent Literature 4] Japanese Unexamined Patent Publication (Kokai) No. 2013-171898

[Patent Literature 5] Japanese Unexamined Patent Publication (Kokai) No. 2007-246289

SUMMARY OF THE INVENTION

However, even in an epitaxial wafer which is typically called a "crack-free" epitaxial wafer, there exists a crack in a region within approximately several millimeters from an outer peripheral portion due to generation of a crown.

There is concern that this crack may extend or may cause contamination of a manufacturing line by triggering delamination of an epitaxial growth layer during a manufacturing process of a device. Therefore, an epitaxial substrate which is completely free from cracks is desired.

The present invention has been made in view of the above problems and it is a purpose to providing a method of manufacturing an epitaxial wafer in which an epitaxial wafer which is completely free from cracks can be obtained.

To achieve the above purpose, the present invention provides a method of manufacturing an epitaxial wafer having an epitaxial layer on a silicon-based substrate, the method of manufacturing including epitaxially growing a semiconductor layer on the silicon-based substrate after applying terrace processing to an outer peripheral portion of the silicon-based substrate.

As described above, by epitaxially growing the semiconductor layer on the silicon-based substrate after applying terrace processing to the outer peripheral portion of the silicon-based substrate, it is possible to easily obtain an epitaxial wafer which is completely free from cracks, and it is possible to suppress extension of a crack or contamination of a manufacturing line due to delamination of the epitaxial growth layer being triggered in a post-process such as a device manufacturing process.

At this time, it is preferable to perform the terrace processing through grinding using a grinding wheel.

As described above, by performing terrace processing through grinding using a grinding wheel, it is possible to extremely easily perform terrace processing.

At this time, it is preferable to further include a process of making the ground terrace surface a mirror surface or a quasi-mirror surface.

As described above, by making the ground terrace surface a mirror surface or a quasi-mirror surface in this manner, it is possible to suppress particle generation from the ground terrace surface and prevent a failure due to particle generation.

At this time, it is possible to adopt a configuration where the semiconductor layer to be epitaxially grown is composed of a nitride semiconductor.

A nitride semiconductor is preferably used as the semiconductor layer to be epitaxially grown.

At this time, the nitride semiconductor can be one or more of any of AlN, GaN, InN and a mixed crystal of these.

The above materials can be preferably used as the nitride semiconductor used for the semiconductor layer to be epitaxially grown.

Further, the present invention provides a silicon-based substrate for epitaxial growth for epitaxially growing a semiconductor layer, the silicon-based substrate having a terrace portion which is obtained by applying terrace processing to an outer peripheral portion of the silicon-based substrate.

If the silicon-based substrate has a terrace portion which is obtained by applying terrace processing to the outer peripheral portion in this manner, by epitaxially growing the semiconductor layer using this silicon-based substrate, it is possible to easily obtain an epitaxial wafer which is completely free from cracks, and, it is possible to suppress extension of a crack or contamination of a manufacturing line due to delamination of the epitaxial growth layer being triggered in a post-process such as a device manufacturing process.

At this time, a terrace surface of the terrace portion is preferable a mirror surface or a quasi-mirror surface.

If the terrace surface of the terrace portion is a mirror surface or a quasi-mirror surface, it is possible to suppress particle generation from the terrace surface and prevent a failure due to particle generation.

At this time, it is possible to adopt a configuration where the semiconductor layer to be epitaxially grown is composed of a nitride semiconductor.

The present invention can be preferably applied to the silicon-based substrate for epitaxial growth which uses a nitride semiconductor as the semiconductor layer to be epitaxially grown.

At this time, the nitride semiconductor can be one or more of any of AlN, GaN, InN and a mixed crystal of these.

The present invention can be preferably applied to a silicon-based substrate for epitaxial growth which uses the materials as described above as the nitride semiconductor used for the semiconductor layer to be epitaxially grown.

Further, the present invention provides an epitaxial wafer in which an epitaxial layer is grown on the above silicon-based substrate for epitaxial growth.

According to the epitaxial wafer in which the epitaxial layer is grown on the silicon-based substrate having a terrace portion which is obtained by applying terrace processing to the outer peripheral portion, it is possible to easily make the epitaxial wafer completely free from cracks and it is possible to make an epitaxial wafer which causes neither extension of a crack nor contamination of a manufacturing line due to delamination of the epitaxial growth layer being triggered in a post-process such as a device manufacturing process.

As described above, according to the present invention, it is possible to easily obtain a semiconductor epitaxial wafer which is completely free from cracks, and it is possible to suppress extension of a crack or contamination of a manufacturing line due to delamination of an epitaxial growth layer being triggered in a post-process such as a device manufacturing process.

DETAILED DESCRIPTION OF THE PREFERRED EMBODIMENTS

While an embodiment according to the present invention will be described below in detail with reference to the drawings, the present invention is not limited thereto.

As described above, even in an epitaxial wafer which is called a "crack-free" epitaxial wafer, there exists a crack in a region within approximately several millimeters from an outer peripheral portion due to generation of a crown, and there is concern that this crack may extend during a manufacturing process of a device or may cause contamination of a manufacturing line by triggering delamination of an epitaxial growth layer. Therefore, an epitaxial substrate which is completely free from cracks is desired.

Accordingly, the present inventors have studied earnestly a method of manufacturing an epitaxial wafer which can easily obtain an epitaxial wafer which is completely free from cracks and which can suppress extension of a crack or contamination of a manufacturing line due to delamination of an epitaxial growth layer being triggered in a post-process such as a device manufacturing process.

As a result, the present inventors have found that by epitaxially growing a semiconductor layer on a silicon-based substrate after applying terrace processing to an outer peripheral portion of the silicon-based substrate, it is possible to easily obtain an epitaxial wafer which is completely free from cracks and it is possible to suppress extension of a crack or contamination of a manufacturing line due to delamination of an epitaxial growth layer being triggered in a post-process such as a device manufacturing process, thereby bringing the present invention to completion.

A method of manufacturing a semiconductor epitaxial wafer according to the present invention will be explained below with reference to FIG. 1.

First, as illustrated in FIG. 1(a), a silicon-based substrate is prepared. The silicon-based substrate is, for example, a silicon (Si) substrate, a silicon carbide (SiC) substrate, or the like.

Then, as illustrated in FIG. 1(b), terrace processing is applied to an outer peripheral portion of the silicon-based substrate.

Here, as illustrated in FIG. 2(e), the terrace processing is processing of removing the outer peripheral portion of a constant width of a surface of the silicon substrate at a side an epitaxial layer is formed so as to be flat without changing an outer diameter, a portion subjected to this processing is referred to as a terrace portion, and the formed flat surface is referred to as a terrace surface.

In this terrace processing, for example, grinding is performed to obtain a portion with a width of equal to or greater than 1 mm, preferably, 1 to 3 mm, and a depth of equal to or greater than 3 µm, preferably, 3 to 50 µm using a grinding wheel having a grain size of approximately size #800 to #4000.

Figure 2:
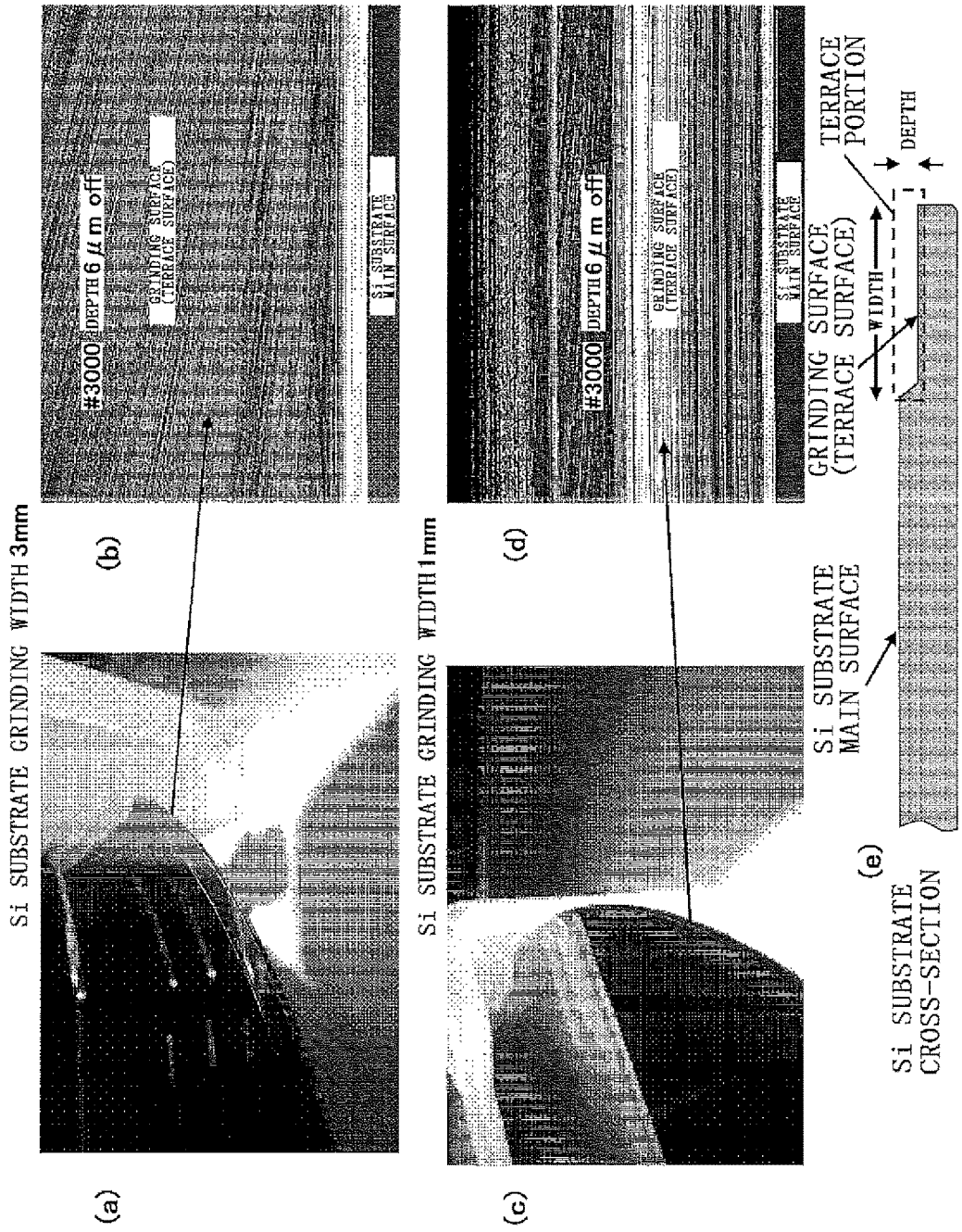
FIG. 2 is a diagram illustrating a silicon-based substrate subjected to terrace processing obtained in a manufacturing process of the method of manufacturing the epitaxial wafer according to the present invention.

The silicon-based substrate subjected to terrace processing in this manner is illustrated in FIG. 2.

FIG. 2(a) is a photograph of an outer peripheral portion of a wafer in which a portion with a width of 3 mm and a depth of 6 µm is ground, and FIG. 2(b) is a magnified photograph of FIG. 2(a).

Further, FIG. 2(c) is a photograph of an outer peripheral portion of a wafer in which a portion with a width of 1 mm and a depth of 6 μm is ground, and FIG. 2(d) is a magnified photograph of FIG. 2(c).

Still further, FIG. 2(e) is a cross-sectional diagram of a surrounding portion of the ground silicon substrate.

By applying terrace processing to the outer peripheral portion of the silicon-based substrate in this manner, it is possible to suppress a crack at the outer peripheral portion or delamination of an epitaxial layer during epitaxial growth in a post-process and suppress generation of a reaction mark. It is considered that generation of a crack and a reaction mark is suppressed as a result of stress being relaxed by an epitaxially grown layer becoming a polycrystal at the terrace portion subjected to terrace processing.

Further, it is also possible to make the terrace surface a mirror surface or a quasi-mirror surface by performing etching using a mixed acid, or the like, after performing grinding. By making the terrace surface a mirror surface or a quasi-mirror surface by performing etching in this manner, it is possible to suppress particle generation and prevent a failure due to particle generation.

Next, as illustrated in FIG. 1(c), an epitaxial growth layer is formed on a silicon-based substrate set at 900° C. or higher, for example, 1200° C. using an epitaxial growth method such as a Metal Organic Chemical Vapor Deposition (MOCVD) method.

While the composition of this epitaxial layer is not particularly limited, the epitaxial layer can be a nitride semiconductor, and this nitride semiconductor can be one or more of any of AlN, AlGaN and GaN. For example, it is possible to grow a buffer layer in which an AlGaN layer and a GaN layer are alternately laminated after forming an AlN layer, and form a GaN layer on a surface of the buffer layer, thereby it is possible to grow the epitaxial layer with a thickness of approximately 3 to 10 μm as a whole.

Figure 1:
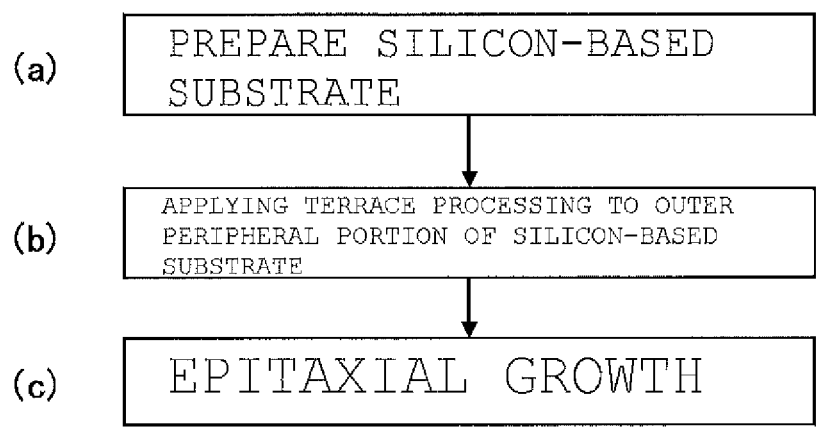
FIG. 1 is a diagram illustrating an example of manufacturing flow of a method of manufacturing an epitaxial wafer according to the present invention.

By manufacturing an epitaxial wafer according to the manufacturing flow in FIG. 1 described above, it is possible to easily obtain a semiconductor epitaxial wafer which is completely free from cracks and it is possible to suppress extension of a crack or contamination of a manufacturing line due to delamination of an epitaxial growth layer being triggered in a post-process such as a device manufacturing process.

Next, a silicon-based substrate for epitaxial growth according to the present invention will be explained.

The silicon-based substrate for epitaxial growth according to the present invention is a silicon-based substrate for epitaxial growth for epitaxially growing a semiconductor layer, the silicon-based substrate for epitaxial growth having a terrace portion which is obtained by applying terrace processing to an outer peripheral portion of the silicon-based substrate (see FIG. 2(e)).

By epitaxially growing a semiconductor layer using a silicon-based substrate having a terrace portion which is obtained by applying terrace processing to an outer peripheral portion, it is possible to easily obtain an epitaxial wafer which is completely free from cracks, and it is possible to suppress extension of a crack or contamination of a manufacturing line due to delamination of an epitaxial growth layer being triggered in a post-process such as a device manufacturing process.

Further, a terrace surface of the terrace portion is preferably a mirror surface or a quasi-mirror surface.

If the terrace surface of the terrace surface is a mirror surface or a quasi-mirror surface in this manner, it is possible to suppress particle generation from the terrace surface and prevent a failure due to particle generation.

Still further, it is possible to adopt a configuration where the semiconductor layer to be epitaxially grown is composed of a nitride semiconductor.

The present invention can be preferably applied to a silicon-based substrate for epitaxial growth in which a nitride semiconductor is used as the semiconductor layer to be epitaxially grown.

This nitride semiconductor can be one or more of any of AlN, GaN, InN and a mixed crystal of these.

The present invention can be preferably applied to the silicon-based substrate for epitaxial growth in which the materials as described above are used as the nitride semiconductor used for the semiconductor layer to be epitaxially grown.

Further, the epitaxial wafer according to the present invention is an epitaxial wafer, wherein an epitaxial layer is grown on the above silicon-based substrate for epitaxial growth in the epitaxial wafer.

According to such an epitaxial wafer in which the epitaxial layer is grown on the silicon-based substrate having the terrace portion which is obtained by applying terrace processing to the outer peripheral portion in this manner, it is possible to easily make the epitaxial wafer completely free from cracks and it is possible to make an epitaxial wafer which causes neither extension of a crack nor contamination of a manufacturing line due to delamination of an epitaxial growth layer being triggered in a post-process such as a device manufacturing process.

EXAMPLES

While the present invention will be more specifically described below using an example and a comparative example, the present invention is not restricted thereto.

Example

Terrace processing was applied to an outer peripheral portion of a silicon substrate having a diameter of 150 mm and a thickness of 1 mm through grinding using a grinding wheel having a grain size of #3000 by a width of 3 mm, and a depth of two levels of 6 μm and 50 μm.

After an AlN layer was formed through epitaxial growth on the silicon substrate subjected to terrace processing, a buffer layer in which an AlGaN layer and a GaN layer are alternately laminated was epitaxially grown, and a GaN layer was epitaxially grown on a surface of the buffer layer, thereby an epitaxial wafer was manufactured. A thickness of the epitaxial layer was totally 10 μm.

Figure 3:
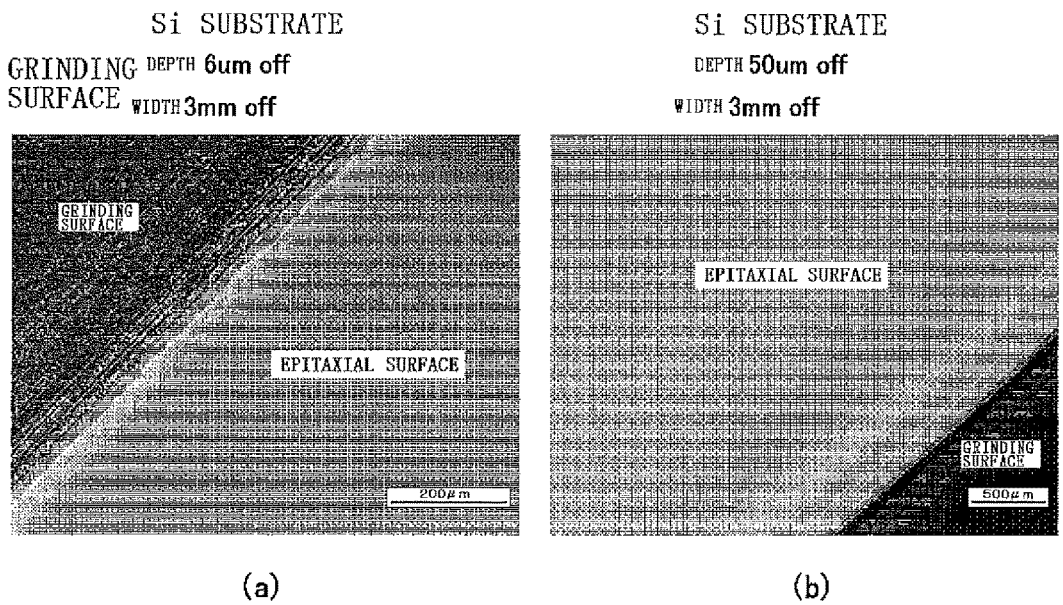
FIG. 3 is a diagram illustrating a surrounding portion of an epitaxial wafer manufactured by a method of manufacturing in an example.

When the outer peripheral portion of the epitaxial wafer manufactured as described above was observed using a collimated light, none of a crack, delamination of an epitaxial layer and generation of a reaction mark was found in both a level of the depth of 6 μm (see FIG. 3(a)) and a level of the depth of 50 μm (see FIG. 3(b)).

Comparative Example

Epitaxial growth was performed on a silicon substrate having a diameter of 150 mm and a thickness of 1 mm in a same manner to the example except that terrace processing was not applied.

Figure 4:
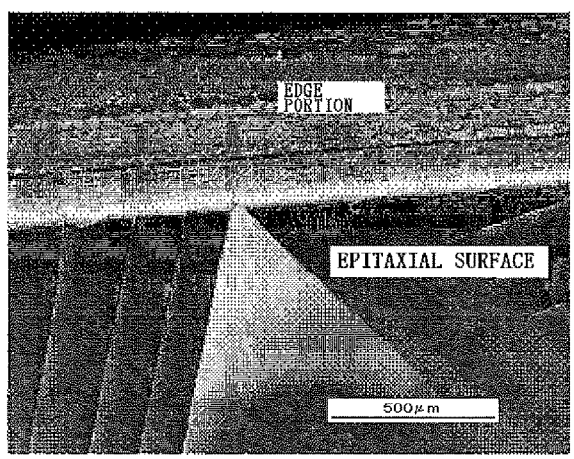
FIG. 4 is a diagram illustrating a surrounding portion of an epitaxial wafer manufactured by a method of manufacturing in a comparative example.

As a result, as illustrated in FIG. 4, cracks were found at substantially the whole circumference of the epitaxial wafer. Further, delamination of an epitaxial layer was scattered at the whole circumference, and reaction marks were sparsely scattered at the whole circumference.

It should be noted that the present invention is not limited to the embodiment. The embodiment is merely an example, and any embodiment having substantially the same configuration and having the same operational effects as those of the technical idea described in claims of the present invention is incorporated into a technical scope of the present invention.

The invention claimed is:

1. A method of manufacturing an epitaxial wafer having a semiconductor layer on a silicon-based substrate, the method of manufacturing the epitaxial wafer comprising:
    applying terrace processing to an outer peripheral portion of the silicon-based substrate in which a constant width of said portion is removed to a depth below the substrate surface without changing its outer diameter to form a terrace portion having a flat surface,
    making a ground terrace surface of the terrace portion a mirror surface or a quasi-mirror surface, and
    epitaxially growing the semiconductor layer on the silicon-based substrate such that the semiconductor layer at the terrace portion becomes a polycrystal directly on the terrace surface,
    wherein the terrace processing is performed through grinding using a grinding wheel.

2. The method of manufacturing the epitaxial wafer according to claim 1,
    wherein the semiconductor layer to be epitaxially grown is composed of a nitride semiconductor.

3. The method of manufacturing the epitaxial wafer according to claim 2,
    wherein the nitride semiconductor is one or more of any of AlN, GaN, InN and a mixed crystal of these.

4. The method of manufacturing the epitaxial wafer according to claim 1,
    wherein said width is equal to or greater than 1 mm, and said depth is equal to or greater than 3 µm.

5. The method of manufacturing the epitaxial wafer according to claim 1,
    wherein said width is 1 to 3 mm, and said depth is 3 to 50 µm.

6. An epitaxial wafer in which a semiconductor layer is grown on a silicon-based substrate by epitaxial growth, the epitaxial wafer comprising:
    a terrace portion having a flat surface that is obtained by applying terrace processing to an outer peripheral portion of the silicon-based substrate in which a constant width of said portion is removed to a depth below the substrate surface without changing its outer diameter,
    wherein a terrace surface of the terrace portion is a mirror surface or a quasi-mirror surface, and
    wherein the semiconductor layer at the terrace portion is a polycrystal directly on the terrace surface.

7. The epitaxial wafer according to claim 6,
    wherein the semiconductor layer to be epitaxially grown is composed of a nitride semiconductor.

8. The epitaxial wafer according to claim 7,
    wherein the nitride semiconductor is one or more of any of AlN, GaN, InN and a mixed crystal of these.

9. The epitaxial wafer according to claim 6,
    wherein said width is equal to or greater than 1 mm, and said depth is equal to or greater than 3 µm.

10. The epitaxial wafer according to claim 6,
    wherein said width is 1 to 3 mm, and said depth is 3 to 50 µm.

* * * * *